United States Patent
Lin

(10) Patent No.: US 11,416,358 B2
(45) Date of Patent: Aug. 16, 2022

(54) REORDERING CIRCUIT OF MEMORY, METHOD OF REORDERING MEMORY BITS, AND ACCUMULATION CIRCUIT

(71) Applicant: NS POLES TECHNOLOGY CORP., Zhuhai (CN)

(72) Inventor: Chin-Hsi Lin, Zhuhai (CN)

(73) Assignee: NS Poles Technology Corp., Zhuhai (CN)

( * ) Notice: Subject to any disclaimer, the term of this patent is extended or adjusted under 35 U.S.C. 154(b) by 283 days.

(21) Appl. No.: 16/787,301

(22) Filed: Feb. 11, 2020

(65) Prior Publication Data
US 2021/0149778 A1 May 20, 2021

(30) Foreign Application Priority Data

Nov. 20, 2019 (TW) ................................. 108142056

(51) Int. Cl.
*G06F 11/20* (2006.01)
*H03K 19/20* (2006.01)

(52) U.S. Cl.
CPC ...... *G06F 11/2094* (2013.01); *G06F 2201/82* (2013.01); *H03K 19/20* (2013.01)

(58) Field of Classification Search
CPC .................................................. G06F 11/2094
USPC .......................................................... 714/6.13
See application file for complete search history.

(56) References Cited

U.S. PATENT DOCUMENTS

| | | | |
|---|---|---|---|
| 2016/0041869 A1* | 2/2016 | Davis ............... | H03M 13/3761 714/773 |
| 2019/0087291 A1* | 3/2019 | Schicht ............... | G06F 11/2094 |
| 2019/0237154 A1* | 8/2019 | Choi ....................... | G11C 29/44 |
| 2019/0354479 A1* | 11/2019 | Pawlowski .......... | G06F 11/1076 |
| 2020/0111541 A1* | 4/2020 | Kim ........................ | G11C 8/10 |
| 2021/0042188 A1* | 2/2021 | Chen .................... | G06F 11/1068 |

* cited by examiner

*Primary Examiner* — Chae M Ko
(74) *Attorney, Agent, or Firm* — Rosenberg, Klein & Lee

(57) ABSTRACT

A method of reordering memory bits includes steps of: providing multiple pieces of bit repair data corresponding to memory bits and used to mark whether any one of the memory bits is defective bit; generating selection signals based on multiple pieces of bit repair data; selecting and coupling good memory bits of the memory bits to multiple input/output terminals of a memory, respectively, based on the multiple pieces of bit repair data and the selection signals or based on the selection signals.

13 Claims, 17 Drawing Sheets

US 11,416,358 B2

REORDERING CIRCUIT OF MEMORY, METHOD OF REORDERING MEMORY BITS, AND ACCUMULATION CIRCUIT

This application claims priority for Taiwan (R.O.C.) patent application no. 108142056 filed on Nov. 20, 2019, the content of which is incorporated by reference in its entirely.

BACKGROUND OF THE INVENTION

1. Field of the Invention

The present invention relates to a memory, more particularly to a reordering circuit and method of reordering memory bits of a memory.

2. Description of the Related Art

A memory may have defective memory bits because of various non-ideal factors in the manufacturing process. Therefore, in original design of the memory, some internal space was used to set redundancy memory bits. When defective memory bits of the memory are detected during test process, the redundancy memory bits can be used to replace the detected defective memory bits, so as to repair performance of the memory and improve memory manufacturing yield. The conventional method of repairing memory is to add an auxiliary circuit including row redundancy or column redundancy, so that when a defective memory bit is found in the memory, the row redundancy or column redundancy can be used to replace the row or column of the defective memory bit.

However, since the conventional method is to replace an entire row or column of memory bits, other good memory bits in the row or column are also replaced in addition to the defective memory bits, and it causes waste. Furthermore, as memory size is reduced and memory capacity is increased, the density of memory bit arrays is also increased, so the number of defective memory bits is also increased, and the space requirement for setting row or column redundancies is also increased, and an extra-large area is required to allocate enough memory bits of extra row or column redundancies for replacement. Therefore, the conventional method of replacing an entire row or an entire column of memory bits is no longer applicable to a small-sized and large-capacity memory. Compared with the conventional method, the present invention uses a method of replacing a defective bit by using a bit to achieve a more efficient repairing effect in the case of using redundant memory the same or less than that of the traditional method.

SUMMARY OF THE INVENTION

An objective of the present invention is to provide a reordering circuit and a method of reordering memory bits of a memory.

According to the present invention, the method of reordering memory bits comprises steps of: providing a plurality of pieces of bit repair data corresponding to a plurality of memory bits to determine whether any one of the plurality of corresponding memory bits is defective; generating a plurality of selection signals based on the plurality of pieces of bit repair data; selecting and coupling the plurality of good memory bits of the plurality of memory bits to a plurality of input/output terminals of the memory, respectively, based on the plurality of pieces of bit repair data and the plurality of selection signals or based on the plurality of selection signals.

According to the present invention, a reordering circuit of a memory comprises a plurality of determination circuits. In an embodiment, the plurality of determination circuits receive a plurality of pieces of first bit repair data respectively corresponding to a plurality of general memory bits to generates plurality of selection signals, the reordering circuit selects and couples good memory bits of the plurality of general memory bits and the plurality of redundancy memory bits to a plurality of input/output terminals of the memory, based on the plurality of pieces of first bit repair data and the plurality of selection signals. In another embodiment, an Mth determination circuit of the plurality of determination circuits can generate a selection signal based on Mth~(M+N)th ones of the plurality of pieces of bit repair data corresponding to the plurality of memory bits, wherein M and N are integers higher than 0, and the plurality of memory bits comprise a plurality of general memory bits and a plurality of redundancy memory bits, and the reordering circuit selects and couples a good memory bit of the Mth~(M+N)th memory bits to an input/output terminal of the memory, based on the selection signal.

Compared with the conventional method, the method of using bit to replace defective bit according to the present invention can achieve more efficient repairing effect by using the redundancy memory equal to or less than that of the conventional method. Furthermore, the conventional method requires more complex circuit to determine a position of a defective bit and the unused redundancy memory, and it causes larger area and slower processing speed; and the reordering circuit of the present invention can use simple logic gate to determine a defective bit and unused redundancy memory, so as to achieve advantages of a smaller area and a higher processing speed.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
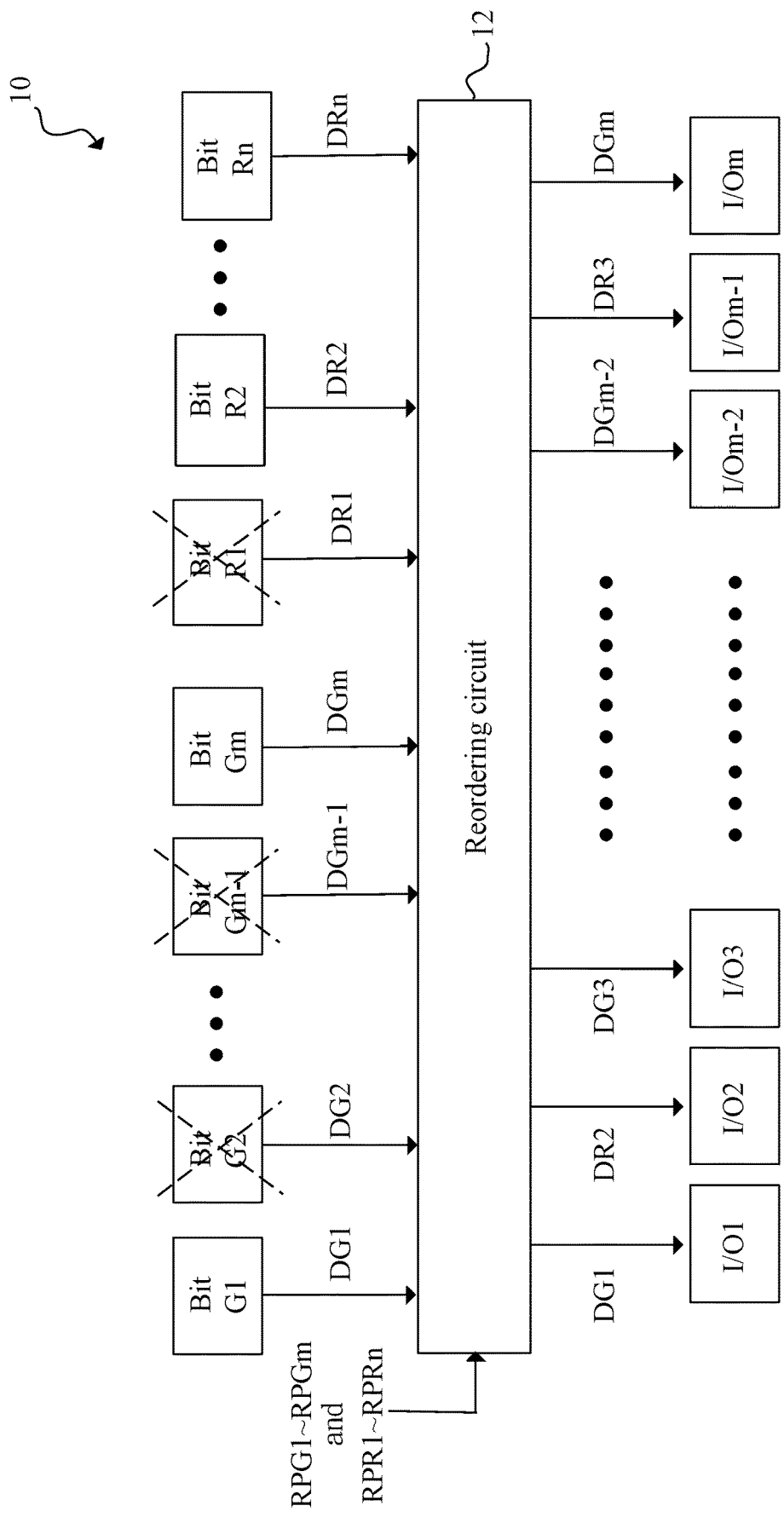
FIG. 1 shows a memory using a reordering circuit of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

FIG. 1 shows a memory 10 using a reordering circuit of the present invention. As shown in FIG. 1, the memory 10 comprises a plurality of memory bits G1~Gm and R1~Rn, a reordering circuit 12, and a plurality of input/output terminals I/O1~I/Om, wherein m and n are positive integers. The memory bits G1~Gm are general memory bits, and the memory bits R1~Rn are redundancy memory bits. A plurality of pieces of data DG1~DGm are multiple pieces of data stored in the memory bits G1~Gm, and a plurality of pieces of data DR1~DRn are multiple pieces of data stored in the memory bits R1~Rn. In following illustration, for convenience in explanation and comprehension of technology of the present invention, the pieces of data DG1~DGm and DR1~DRn are equivalently regarded as the memory bits G1~Gm and R1~Rn, respectively. After being tested, the memory 10 generates a plurality of pieces of bit repair data RPG1~RPGm and RPR1~RPRn, wherein the pieces of bit repair data RPG1~RPGm correspond to the general memory bits G1~Gm, respectively, and the pieces of bit repair data RPR1~RPRn correspond to the redundancy memory bits R1~Rn, respectively. The plurality of pieces of bit repair data RPG1~RPGm and RPR1~RPRn are used to mark whether any one of the corresponding general memory bits is a defective bit. The reordering circuit 12 selects and couples m good memory bits of the plurality of memory bits 12 to a plurality of input/output terminals I/O1~I/Om of the memory 10 in a sequential order, based on the plurality of pieces of bit repair data RPG1~RPGm and the RPR1~RPRn. The reordering circuit 12 determines whether the general memory bits G1~Gm are good memory bits, and if yes, the general memory bits G1~Gm are coupled to the input/output terminals I/O1~I/Om; otherwise, if a defective bit exists in the general memory bits G1~Gm, a good bit is selected from the redundancy memory bits R1~Rn to replace the defective general memory bit, and the selected good one of the redundancy memory bits R1~Rn is coupled to the input/output terminals I/O1~I/Om.

As shown in the embodiment of FIG. 1, the bit G2, the bit Gm-1, and the bit R1 of the plurality of memory bits G1~Gm and R1~Rn are defective memory bits, and when the reordering circuit 12 makes the memory bits correspond to the input/output terminals I/O1~I/Om, the reordering circuit 12 determines that the first general memory bit G1 is a good memory bit based on the bit repair data RPG1 and then couples the bit G1 to the first input/output terminal I/O1, so that the data DG1 of the bit G1 can be accessed from the input/output terminal I/O1. Next, the reordering circuit 12 determines that the second general memory bit G2 is a defective memory bit based on the bit repair data RPG2, so the reordering circuit 12 excludes the bit G2 and selects one of the redundancy memory bits R1~Rn to replace the bit G2; at this time, the reordering circuit 12 can determine that the first redundancy memory bit R1 is a defective memory bit and the second redundancy memory bit R2 is a good memory bit based on the bit repair data RPR1 and RPR2, and the reordering circuit 12 selects the second redundancy memory bit R2 to replace the bit G2 and couples the second redundancy memory bit R2 to the second input/output terminal I/O2, so that the data DR2 of the bit R2 can be accessed from the input/output terminal I/O2. Similarly, the reordering circuit 12 determines whether the bits G3~Gm are good memory bits based on the pieces of bit repair data RPG3~RPGm in a sequential order, and if yes, the bits G3~Gm are coupled to the input/output terminals I/O3~I/Om; otherwise, if any one of the bits G3~Gm is a defective memory bit, for example, the bit Gm-1 is a defective memory bit, the reordering circuit 12 selects and couples the good and unused memory bit R3 of the plurality of redundancy memory bits to the input/output terminal I/Om-1. After the reordering circuit 12 corresponds the input/output terminals I/O1~I/Om to the memory bits one by one, the host can access the pieces of data corresponding to the memory bits through the input/output terminals I/O1~I/Om.

Figure 2:
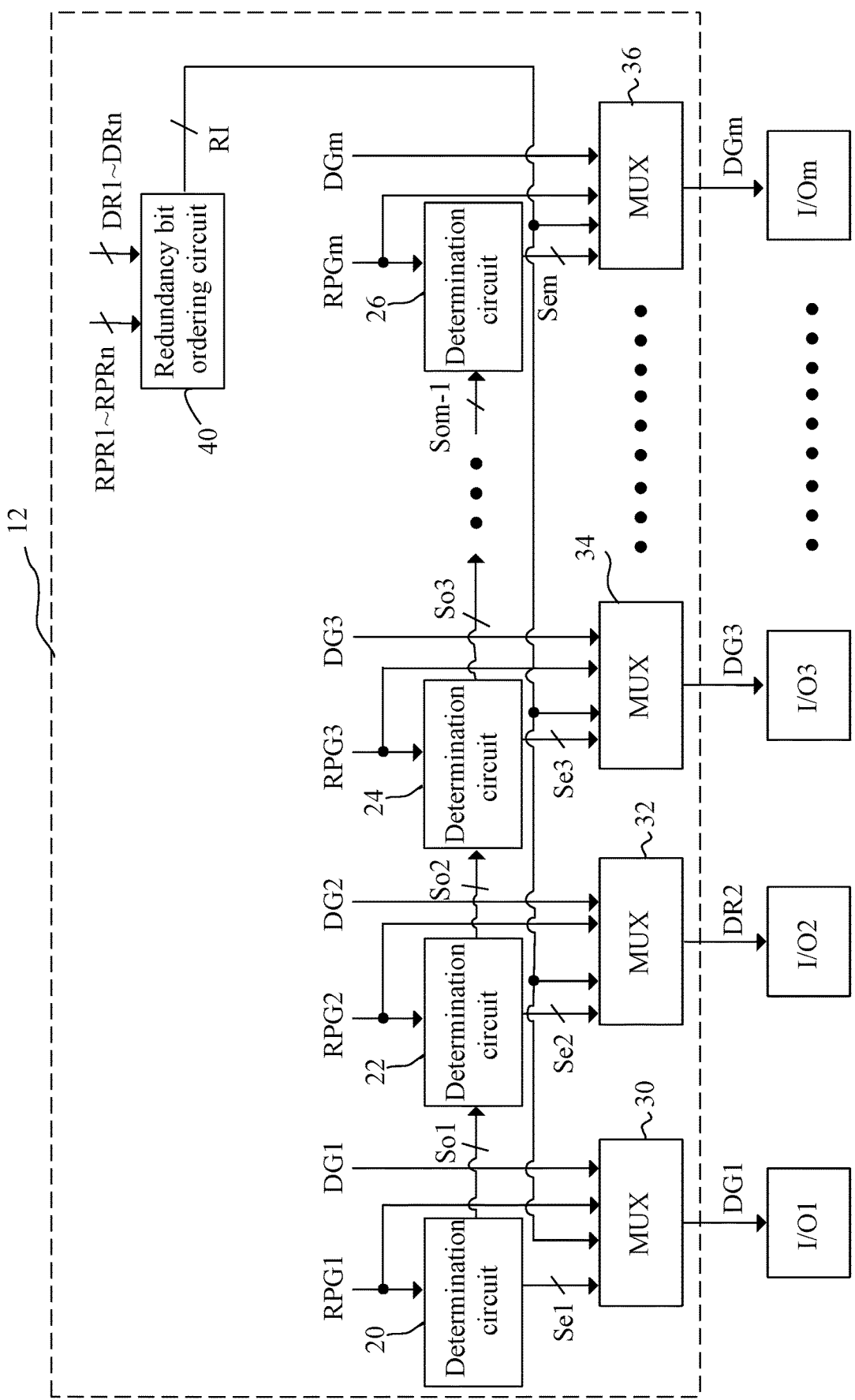
FIG. 2 shows an embodiment of the reordering circuit of FIG. 1.

FIG. 2 shows an embodiment of the reordering circuit 12 of FIG. 1. As shown in FIG. 2, the reordering circuit 12 comprises a plurality of determination circuits 20, 22, 24 and 26, a plurality of multiplexers 30, 32, 34 and 36, and a redundancy bit ordering circuit 40. The first determination circuits 20 of the determination circuits 20, 22, 24 and 26 can generate a selection signal Se1 and an accumulation signal So1 based on the bit repair data RPG1; the second determination circuit 22 can generate a selection signal Se2 and an accumulation signal So2 based on the bit repair data RPG2 and the accumulation signal So1; the third determination circuit 24 can generate a selection signal Se3 and an accumulation signal So3 based on the bit repair data RPG3 and the accumulation signal So2, and so on; the plurality of determination circuits 20, 22, 24 and 26 can receive the pieces of bit repair data RPG1~RPGm and output the selection signals Se1~Sem, respectively. Besides the first determination circuit 20, the remaining determination circuits 22, 24 and 26 generate the selection signals Se2~Sem based on the pieces of received bit repair data and the accumulation signals So1~Som-1 outputted from the previous determination circuits. The plurality of accumulation signals So1~Som-1 can record the next redundancy memory which can be used, or record the number of the used redundancy memory bits. The redundancy bit ordering circuit 40 can connect the good memory bits of the redundancy memory bits R1~Rn (DR1~DRn) to the multiplexers 30, 32, 34 and 36, based on the plurality of pieces of bit repair data RPR1~RPRn. Please refer to FIG. 1, in the embodiment, the memory bit R1 is defective, so the redundancy bit ordering circuit 40 excludes the bit R1, and the output RI of the redundancy bit ordering circuit 40 includes DR2~DRn (R2~Rn). The output terminals of the plurality of multiplexers 30, 32, 34 and 36 are connected to the input/output terminals I/O1~I/Om, respectively. The first multiplexer 30 determines to couple the general memory bit G1 or one of the redundancy memory R2~Rn (that is, DG1 or DR2~DRn) to first input/output terminal I/O1, based on the bit repair data RPG1 and the selection signal Se1. In the embodiment, the general memory bit G1 is a good memory bit, so the multiplexer 30 selects and couples the general memory bit G1(DG1) to the input/output terminal I/O1; the second multiplexer 32 can couple one of the general memory bit G2 or redundancy memory bits R2~Rn to the second input/output terminal I/O2, based on the bit repair data RPG2 and the selection signals Se2. In the embodiment, the general memory bit G2 is a defective memory bit, so the multiplexer 32 selects and couples the memory bit R2(DR2) of the redundancy memory bits R2~Rn(DR2~DRn) to the input/output terminal I/O2; similarly, each of the multiplexers 30, 32, 34 and 36 can couple a memory bit to the corresponding one of the input/output terminals I/O1~I/Om.

Figure 3:
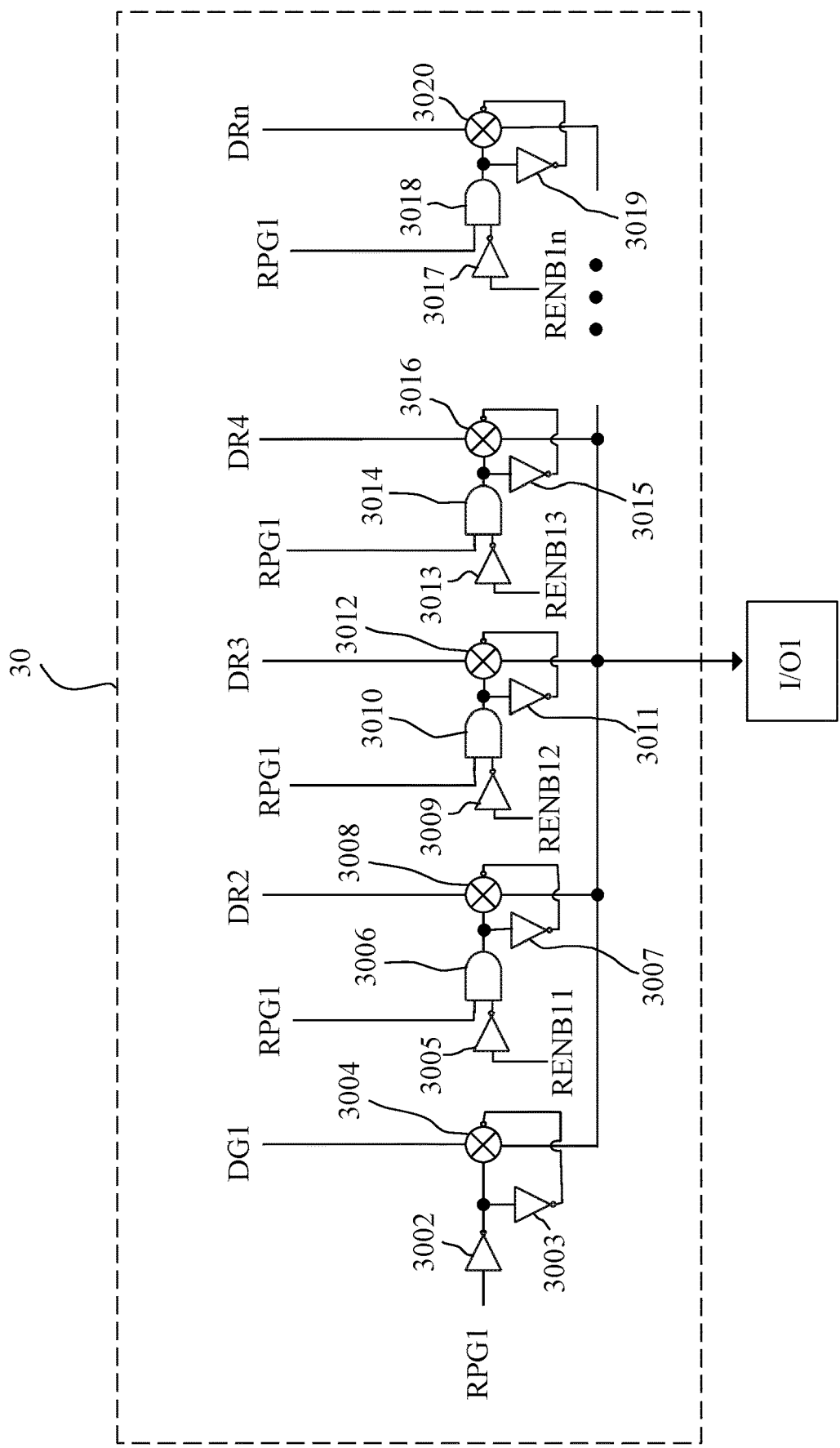
FIG. 3 shows an embodiment of a multiplexer of FIG. 2.

FIG. 3 shows a multiplexer 30 of FIG. 2. As shown in FIG. 3, the multiplexer comprises a plurality of inverters 3002, 3003, 3005, 3007, 3009, 3011, 3013, 3015, 3017 and 3019, a plurality of switches 3004, 3008, 3012, 3016 and 3020, and a plurality of AND gates 3006, 3010, 3014 and 3018. The selection signal Se1 comprises a plurality of signals RENB11~RENB1n inputted to the plurality of inverters 3005, 3009, 3013, 3017, and 3019, respectively; output terminals of a plurality of inverters 3005, 3009, 3013, 3017 and 3019 are connected to input terminals of the AND gates 3006, 3010, 3014 and 3018, respectively; the other input terminals of the plurality of AND gates 3006, 3010, 3014 and 3018 receive the bit repair data RPG1. The switch 3004 is connected between the general memory bit G1(DG1) and the input/output terminal I/O1, the bit repair data RPG1 is used to control on/off operation of the switch 3004 through the inverters 3002 and 3003. The switch 3008 is connected between the redundancy memory bit R2(DR2) and the input/output terminal I/O1, and the AND gate 3006 can control on/off operation of the switch 3008 based on the bit repair data RPG1 and the signal RENB11. The switch 3012 is connected between the redundancy memory bit R3(DR3) and the input/output terminal I/O1, and the AND gate 3010 can control on/off operation of the switch 3012 based on the bit repair data RPG1 and the signal RENB12; the switch 3016 is connected between the redundancy memory bit R4(DR4) and the input/output terminal I/O1, and the AND gate 3014 can control on/off operation of the switch 3016 based on the bit repair data RPG1 and the signal RENB13; the switch 3020 is connected between the redundancy memory bit Rn(DRn) and the input/output terminal I/O1, and the AND gate 3018 can control on/off operation of the switch 3020 based on the bit repair data RPG1 and the signal RENB1n. When the bit repair data RPG1 is "0", the switch 3004 is turned on, so that the memory bit G1(DG1) is coupled to the input/output terminal I/O1, and all of the AND gates 3006, 3010, 3014 and 3018 output low-level logic signals "0" to turn off the switches 3008, 3012, 3016, and 3020. When the bit repair data RPG1 is "1", the switch 3004 is turned off, and at this time, the signals RENB11~RENB1n are used to determine which switch to be turned on; for example, when the signal RENB11 is "0" and the remaining signals REN12~REN1n are "1", the switch 3008 is turned on to couple the redundancy memory bit R2(DR2) to the input/output terminal I/O1; when the signal REN1n is "0" and the remaining signals REN11~REN1n-1 are "1", the switch 3020 is turned on to couple the redundancy memory bit Rn(DRn) to the input/output terminal I/O1.

FIG. 3 shows the circuit of the multiplexer 30 only, but the circuits and operations of other multiplexers 32, 34 and 36 are similar to that of the multiplexer 30, and the circuits and operations of the other multiplexers 32, 34 and 36 can be derived from the multiplexer 30 of FIG. 3.

Figure 4:
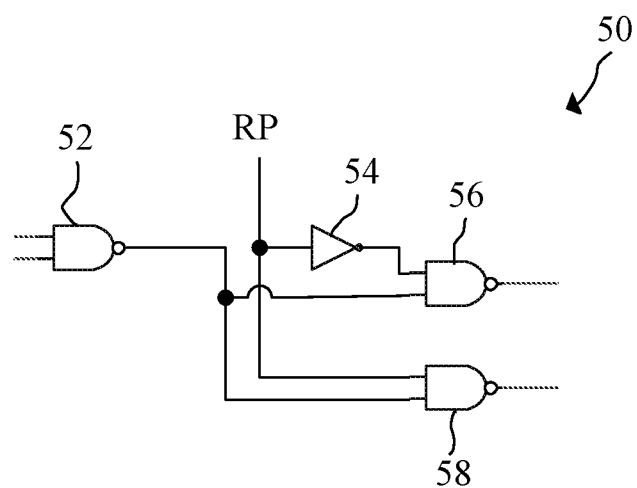
FIG. 4 shows a basic circuit applied to a determination circuit of FIG. 2.
Figure 5:
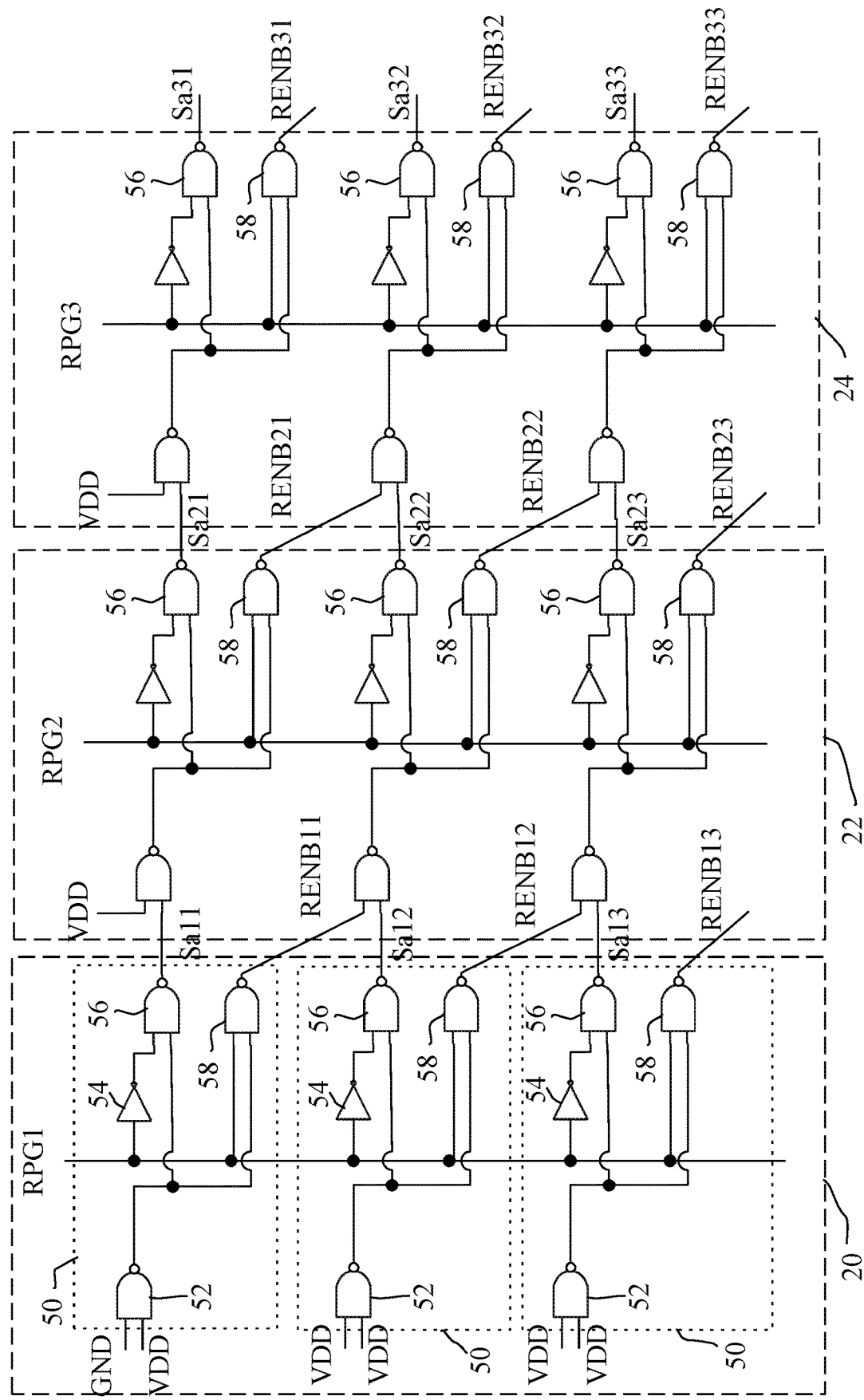
FIG. 5 shows an embodiment of the determination circuit of FIG. 2.
Figure 6:
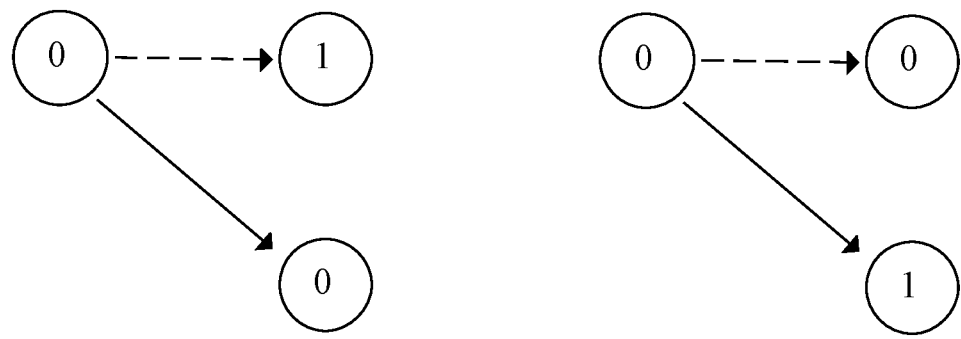
FIG. 6 shows a conceptual diagram of the basic circuit of FIG. 4.

FIG. 4 shows a basic circuit 50 forming the determination circuit of FIG. 2. As shown in FIG. 4, each of the determination circuits 20, 22, 24 and 26 includes a plurality of basic circuits 50, as shown in FIG. 5. The basic circuit 50 shown in FIG. 4 is a logic circuit formed by logic gates, and these logic gates include three NAND gates 52, 56 and 58, and an inverter 54. An output terminal of the NAND gate 52 is connected to input terminals of the NAND gate 56 and 58, the bit repair data RP is inputted to the other input terminal of the NAND gate 56 through the inverter 54, and the other input terminal of the NAND gate 58 receives the bit repair data RP. The signal on the output terminal of the NAND gate 58 can be used to form the selection signal outputted from the determination circuit. When one of input signal of the NAND gate 52 is "0" (response data), the preset response data on the input terminal of the NAND gate 52 can be determined to be the output of the NAND gate 56 or 58 based on the bit repair data RP; in the embodiment, the response data is "0", and when the bit repair data RP is "1", it indicates that the current general memory bit is a defective bit; when the output signal of the NAND gate 58 is the response data "0", a redundancy memory bit is selected to replace the current general memory bit, and the selected redundancy memory bit is coupled to the input/output terminal of the memory 10. When the bit repair data RP is "0", it indicates that the current general memory bit is a good bit, the output signal of the NAND gate 56 is the response data "0", so the current general memory bit is coupled to the input/output terminal of the memory 10. FIG. 6 shows a conceptual diagram of the circuit of FIG. 4. When the bit repair data RP is "1", it is equivalent to shift the preset response data "0" to the output of the NAND gate 58 at a bottom right position, so that the response data "0" can occur at the position different from the input position; when the bit repair data RP is "0", it is equivalent to right shift the output of the NAND gate 52 to the output of the NAND gate 56, so that the designed data can occur on the position the same as the input position.

Figure 7:
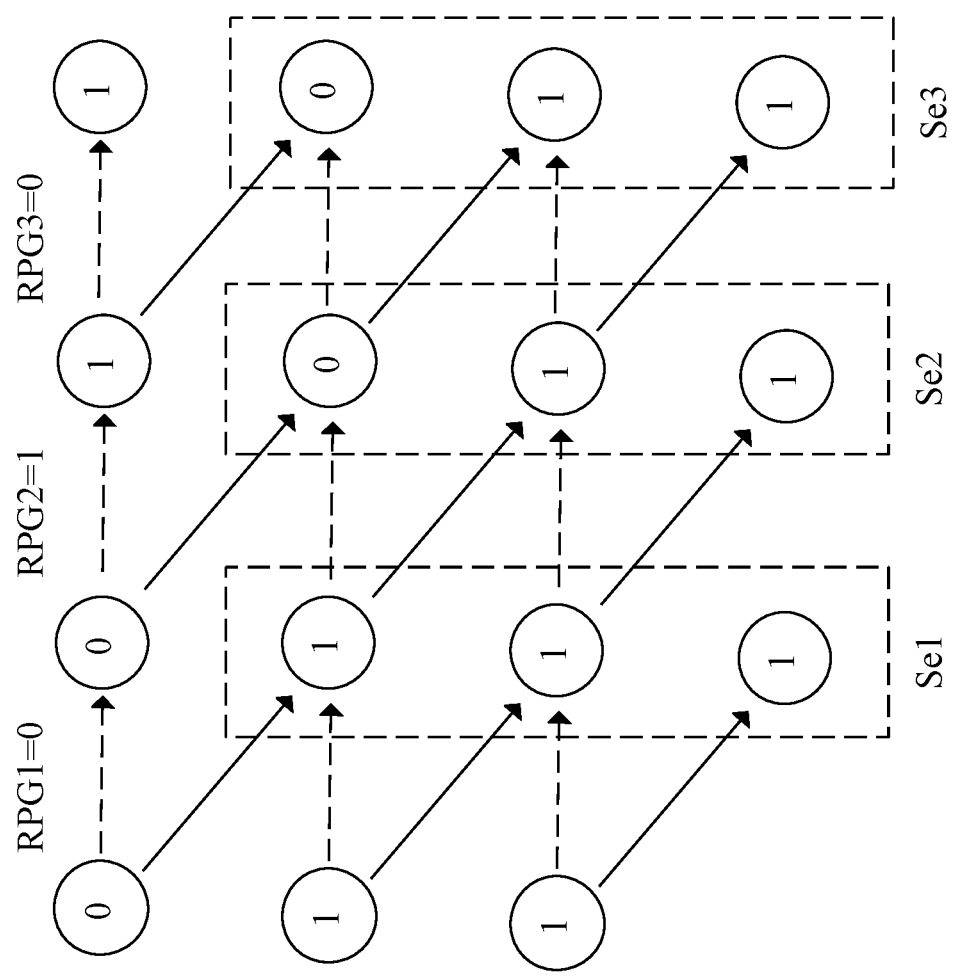
FIG. 7 is a conceptual diagram of the circuit of FIG. 5.

As shown in FIG. 5, each of the determination circuits 20, 22 and 24 is formed by cascading more than n basic circuits 50, wherein n is the number of the redundancy memory bits. The output of each basic circuit 50 is the input of next determination circuit. Since the preset response data GND="0" is connected to the input of the basic circuit 50 at top left position, so that the output at the relative bottom right position becomes the accumulating number of the repair bits and the desired selection signal. The signals RENB11, RENB12 and RENB13 outputted from the NAND gate 58 of the determination circuit 20 can form the selection signal Se1 of FIG. 2, and the signals Sa11, Sa12, Sa13, RENB11, RENB12 and RENB13 outputted from the NAND gates 56 and 58 can form the accumulation signal So1 of the determination circuit 20 shown in FIG. 2. The signals RENB21, RENB22 and RENB23 outputted from the NAND gate 58 of the determination circuit 22 can form the selection signal Se2 of FIG. 2, and the signals Sa21, Sa22, Sa23, RENB21, RENB22 and RENB23 outputted from the NAND gates 56 and 58 can form the output signal So2 of the determination circuit 22 shown in FIG. 2. The signals RENB31, RENB32 and RENB33 outputted from the NAND gate 58 of determination circuit 24 can form the selection signal Se2 of FIG. 2, and the signals Sa31, Sa32, Sa33, RENB31, RENB32 and RENB33 outputted by the NAND gates 56 and 58 can form the output signal So3 of the determination circuit 24 shown in FIG. 2. FIG. 7 shows a conceptual diagram of the circuit of FIG. 5. Please refer to FIGS. 5 and 7. In the determination circuit 22, the bit repair data RPG2 is "1", the response data "0" is downwardly shifted, as shown in FIG. 7, so that the selection signal Se2 is changed to "011", and the first good redundancy memory bit R2 is selected and coupled to the input/output terminal I/O2, the position of the response data "0" in the selection signal can be used to determine the redundancy memory bit to be selected; for example, when the selection signal is "101", the second good redundancy memory bit R3 is selected and coupled to the input/output terminal I/O, and when the selection signal is "110", the third good redundancy memory bit R4 is selected and coupled to the input/output terminal I/O, and so forth. FIG. 5 merely shows partial circuits of the determination circuits 20, 22 and 24, and one of ordinary skill in the art can derive entire circuits of the determination circuits 20, 22 and 24 based on the content shown in FIG. 5. In the embodiment, the determination circuits 20, 22 and 24 are implemented by multiple NAND gates 52, 56 and 58; however, the implementation of the determination circuits 20, 22 and 24 are not limited to the NAND gates, and the determination circuits 20, 22 and 24 can also be implemented by multiple NOR gates or a variety of logic gates, for example, when the preset response data is "1(VDD)", the NAND gates 52, 56 and 58 can be replaced by NOR gates.

Figure 8:
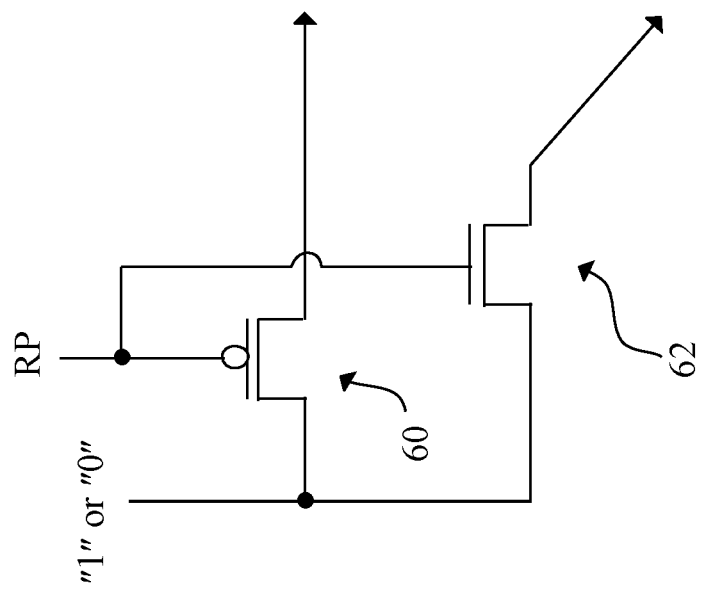
FIG. 8 shows another embodiment of the basic circuit of FIG. 4.

In other implementations, the basic circuit 50 of FIG. 4 is modified as the switch circuit of FIG. 8. As shown in FIG. 8, the switch circuit includes a PMOS transistor 60 and an NMOS transistor 62. The transistors 60 and 62 have input terminals for receiving response data "1" or "0", and control terminals for receiving the bit repair data RP. When the bit repair data RP is "0", the PMOS transistor 60 is turned on and the NMOS transistor 62 is turned off, so that the response data "1" or "0" is outputted through the upper PMOS transistor 60. When the bit repair data RP is "1", the PMOS transistor 60 is turned off and the NMOS transistor 62 is turned on, so the response data "1" or "0" is outputted through the lower NMOS transistor 62.

Figure 9:
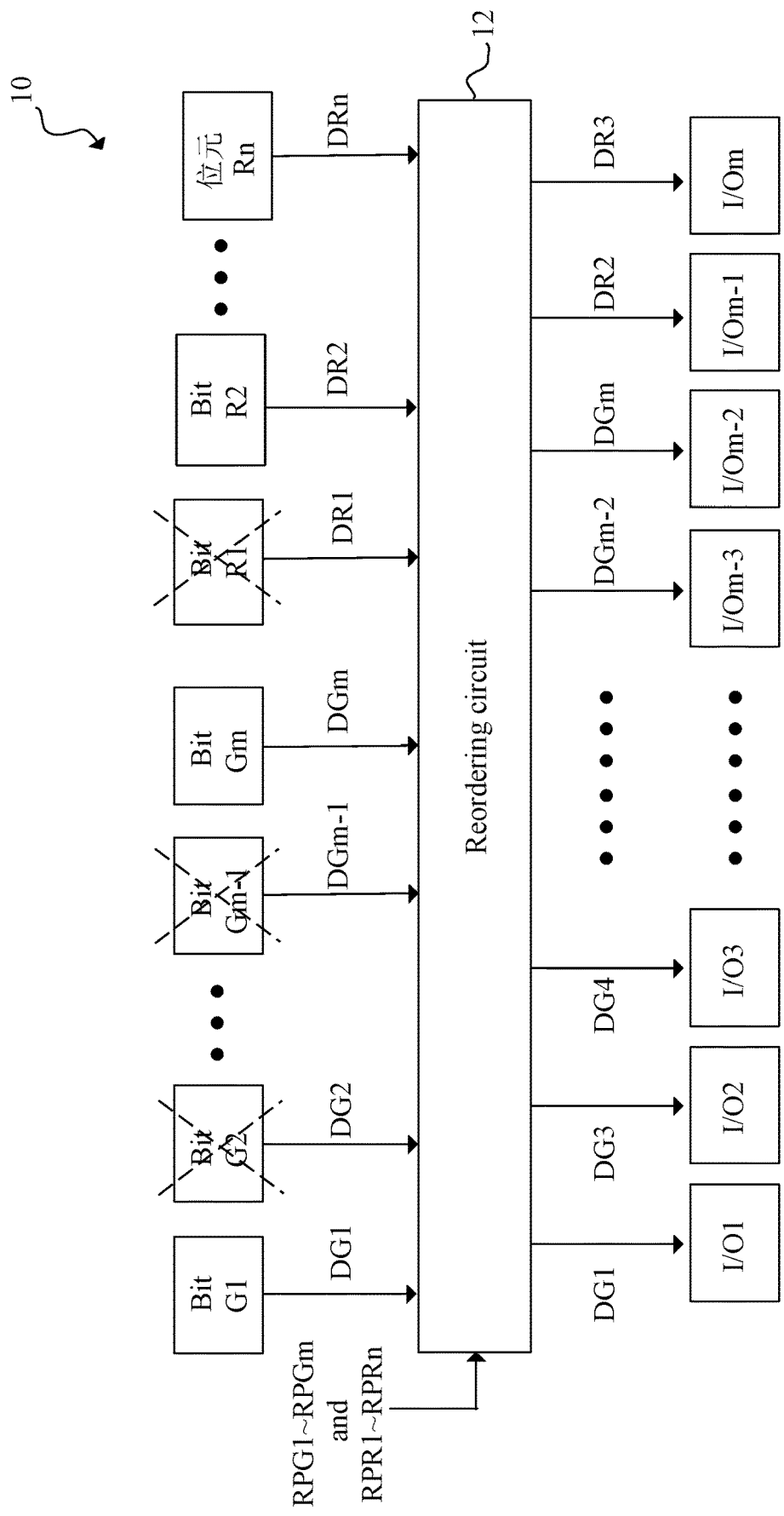
FIG. 9 shows another embodiment of a method of reordering memory bits of the present invention.

FIG. 9 shows another embodiment of a re-sort memory bit of the present invention. As shown in FIG. 9, the reordering circuit 12 can couple the good bits of the plurality of memory bits G1~Gm and R1~Rn to the plurality of input/output terminals I/O1~I/Om, in a sequential order. The reordering circuit 12 can determine whether any one of the plurality of memory bits G1~Gm and R1~Rn is a defective bit, based on the pieces of bit repair data RPG1~RPGm and RPR1~RPRn. As shown in FIG. 9, the reordering circuit 12 determines that the first memory bit G1 is a good bit based on the bit repair data RPG1, and then couples the memory bit G1 to the first input/output terminal I/O1; when the reordering circuit 12 determines that the second memory bit G2 is a defective bit based on the bit repair data RPG2, the reordering circuit 12 excludes the memory bit G2; next, when the reordering circuit 12 determines that the third memory bit G3 is a good bit based on the bit repair data RPG3, the reordering circuit 12 couples the memory bit G3 to the second input/output terminal I/O2, and then repeats above-mentioned operations until each of the input/output terminals I/O1~I/Om is coupled to a memory bit.

Figure 10:
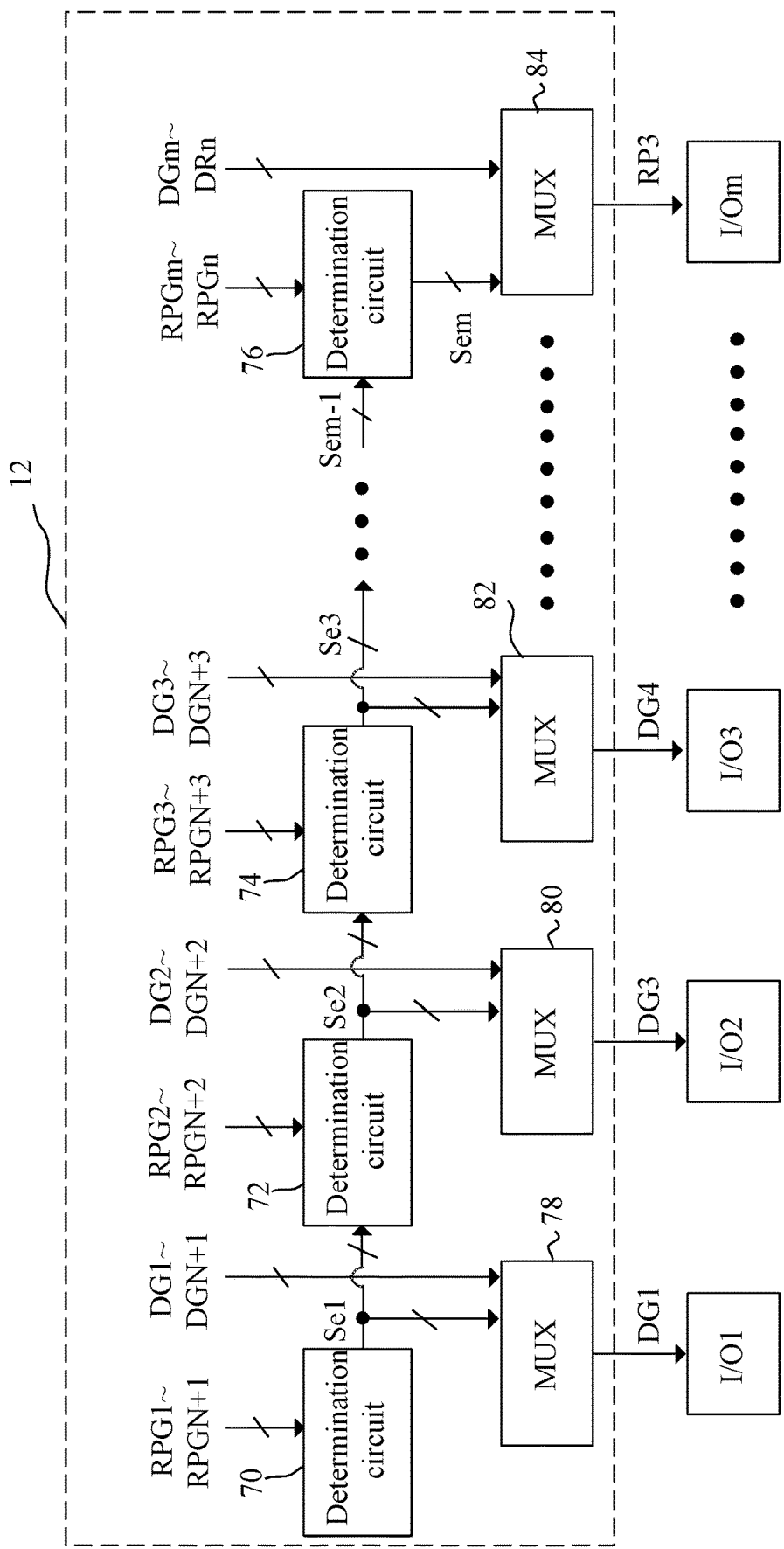
FIG. 10 shows an embodiment of a reordering circuit of FIG. 9.

FIG. 10 shows an embodiment of the reordering circuit 12 of FIG. 9. As shown in FIG. 10, the reordering circuit 12 comprises a plurality of determination circuits 70, 72, 74, and 76, and a plurality of multiplexers 78, 80, 82, and 84. The first determination circuit 70 receives the first bit repair data RPG1 and latter RPG2~RPGN+1 of the plurality of pieces of bit repair data RPG1~RPGm and RPR1~RPRn, to generate the selection signal Se1 based on the first bit repair data RPG1 and RPG2~RPGN+1. The second determination circuit 72 receives the second bit repair data RPG2 and latter RPG3~RPGN+2 of the plurality of pieces of bit repair data, to generate the selection signal Se2 based on the second bit repair data RPG2 and RPG3~RPGN+2, and so forth, the Mth determination circuit receives the Mth bit repair data and the later N pieces of bit repair data of the plurality of pieces of bit repair data, to generate the Mth selection signal SeM based on the Mth bit repair data and the later N pieces of bit repair data. In the embodiment, N is equal to n; that is, N is equal to the number of the redundancy memory bits. In other implementations, N can be higher than or lower than n. The first multiplexer 78 is coupled to the determination circuit 70 and the memory bits G1~GN+1(DG1~DGN+1) corresponding to the pieces of bit repair data RPG1~RPGN+1, and can select and couple a good bit G1(DG1) of the pieces of memory bits G1~GN+1(DG1~DGN+1) to the input/output terminal I/O1 based on the selection signal Se1. The second multiplexer 80 is coupled to the determination circuit 72 and the memory bits G2~GN+2(DG2~DGN+2) corresponding to the pieces of bit repair data RPG2~RPGN+2, and can select and couple a good bit of the plurality of memory bits G2~GN+2(DG2~DGN+2) to the input/output terminal I/O2 based on the selection signal Se2. In this embodiment, the memory bit G2(DG2) is a defective memory bit, so the multiplexer 80 selects and couples the memory bit G3(DG3) to the input/output terminal I/O2. The third multiplexer 82 is coupled to the determination circuit 74 and the memory bit G3~GN+3(DG3~DGN+3) corresponding to the bit repair data RPG3~RPGN+3, and can select and couple a good bit of the plurality of memory bits G3~GN+3(DG3~DGN+3) to the input/output terminal I/O2 based on the selection signal Se3; in this embodiment, the memory bit G3(DG3) is selected to couple to the input/output terminal I/O2 already, so the multiplexer 82 select and couple the memory bit G4(DG4) to the input/output terminal I/O3. Similarly, the Mth multiplexer is coupled to the Mth determination circuit and the memory bits corresponding to the Mth~(M+N)th pieces of bit repair data, and can select and couple a good and unused memory bit of the Mth~(M+N)th memory bits to the Mth input/output terminal I/OM based on the selection signal SeM provided by the Mth determination circuit.

Figure 11:
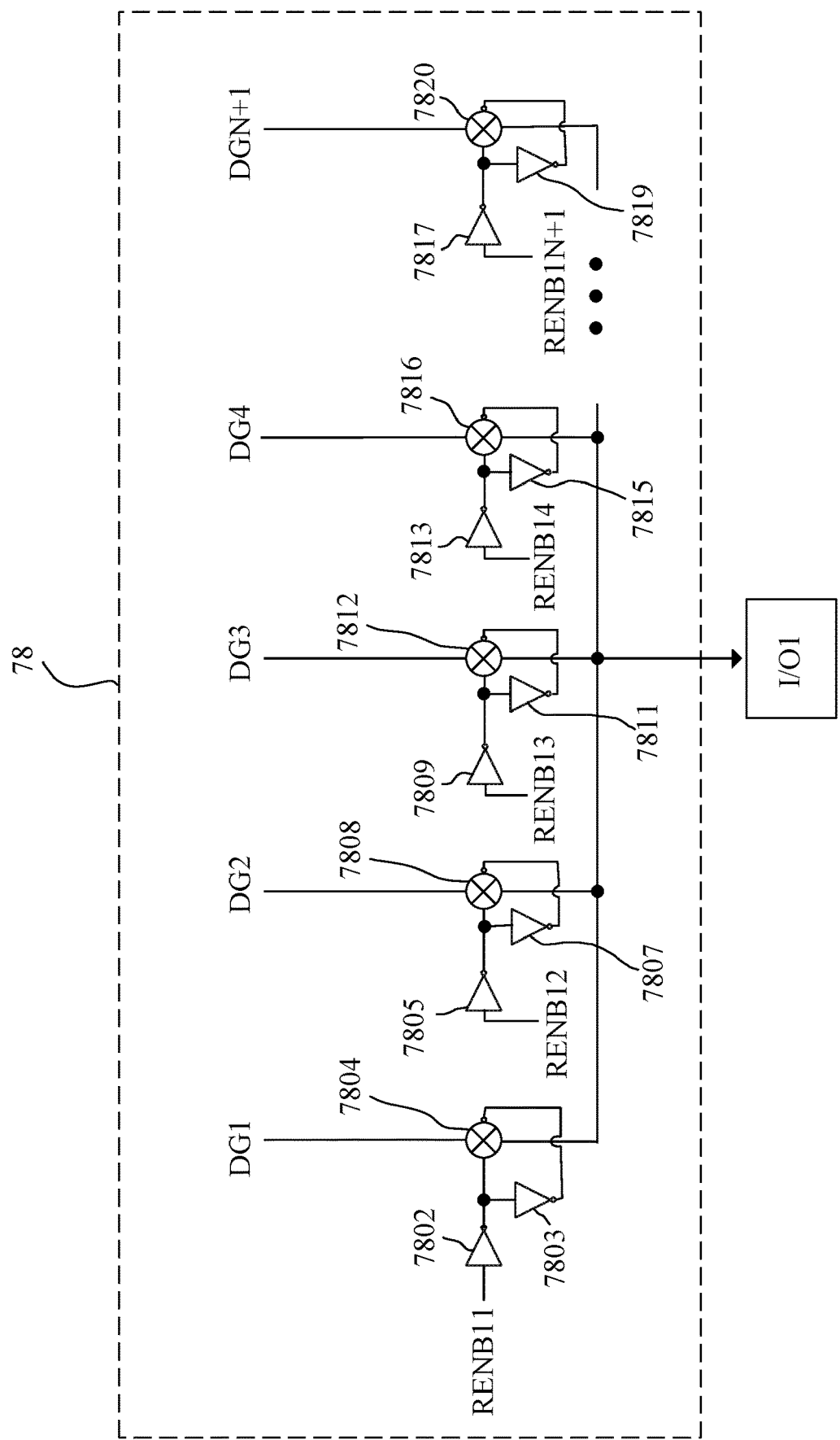
FIG. 11 shows a multiplexer of FIG. 10.

FIG. 11 shows the multiplexer 78 of FIG. 10. As shown in FIG. 11, the multiplexer 78 includes a plurality of inverters 7802, 7803, 7805, 7807, 7809, 7811, 7813, 7815, 7817 and 7819, and a plurality of switches 7804, 7808, 7812, 7816 and 7820. The selection signal Se1 comprises a plurality of signals RENB11~RENB1N+1 inputted to the plurality of inverters 7802, 7805, 7809, 7813, 7817, and 7819, respectively. The switch 7804 is connected between the general memory bit G1(DG1) and the input/output terminal I/O1, and the signal RENB11 can be used to turn on or off the switch 7804 through the inverters 7802 and 7803. The switch 7808 is connected between the general memory bit G2(DG2) and the input/output terminal I/O1, and the signal RENB12 can be used to turn on or off the switch 7808 through the inverters 7805 and 7807. The switch 7812 is connected between the general memory bit G3(DG3) and the input/output terminal I/O1, and the signal RENB13 can be used to turn on or off the switch 7812 through the inverters 7809 and 7811. The switch 7816 is connected between the general memory bit G4(DG4) and the input/output terminal I/O1, and the signal RENB14 can be used to turn on or off the switch 7816 through the inverters 7813 and 7815. The switch 7820 is connected between the general memory bit GN(DGN) and the input/output terminal I/O1, and the signal RENB1N+1 can be used to turn on or off the switch 7820 through the inverters 7817 and 7819. When the signal RENB11 is "0", the switch 7804 is turned on, so that the memory bit G1(DG1) is coupled to the input/output terminal I/O1; when the signal RENB12 is "0", the switch 7808 is turned on, so that the memory bit G2(DG2) is coupled to the input/output terminal I/O1, and so forth; when the signal REN1N+1 is "0", the switch 7820 is turned on, so that the memory bit GN+1(DRn) is coupled to the input/output terminal I/O1.

FIG. 11 shows the circuit of the multiplexer 78 only, but the circuits and operations of other multiplexers 80, 82 and 84 are similar to that of the multiplexer 78, and the circuits and operations of the other multiplexers 80, 82 and 84 can be derived from the multiplexer 78 of FIG. 11.

Figure 12:
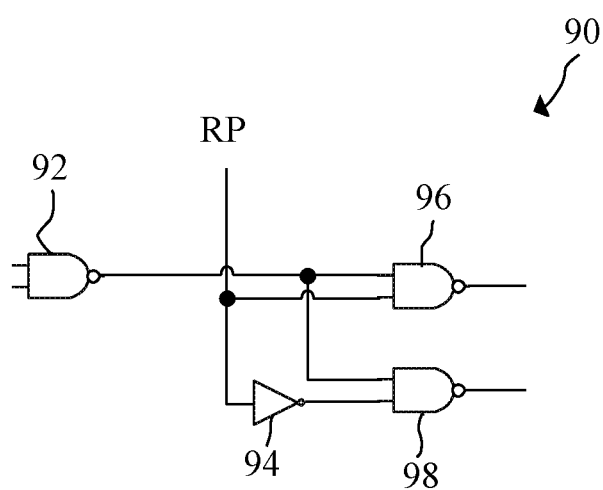
FIG. 12 shows a basic circuit forming the determination circuit of FIG. 10.
Figure 13:
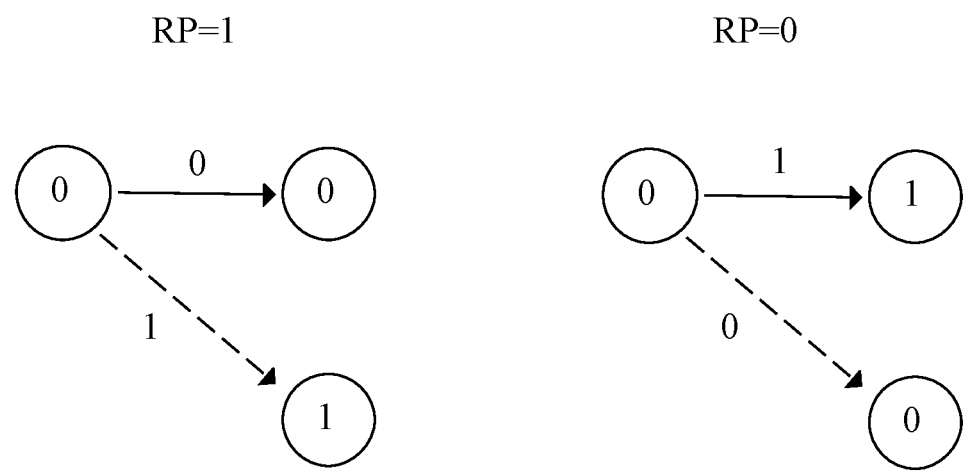
FIG. 13 is a conceptual diagram of the circuit of FIG. 12.

FIG. 12 shows a basic circuit 90 forming the determination circuit of FIG. 10. Each of the determination circuits 70, 72, 74, and 76 includes the plurality of basic circuits 90. The basic circuit 90 shown in FIG. 12 is a logic circuit formed by logic gates, and the logic gates includes three NAND gates 92, 96 and 98, and an inverter 94. An output terminal of the NAND gate 92 is connected to input terminals of the NAND gates 96 and 98, the bit repair data RP is inputted to the other input terminal of the NAND gate 98 through the inverter 94, and the other input terminal of the NAND gate 96 receives the bit repair data RP, the output signal of the NAND gate 98 can be used to form the selection signal outputted from the determination circuit. When one of the input signals of the NAND gate 92 is "0" (response data), the bit repair data RP can be used to determine the response data "0" on the input terminal of the NAND gate 92 to be outputted by the NAND gate 96 or 98. In other implementations, the response data can be "1". When the bit repair data RP is "1", it indicates that the memory bit corresponding thereto is a defective bit, and the output signal of the NAND gate 98 is the response data "0", and the memory bit corresponding to the bit repair data RP is not coupled to the input/output terminal I/Om. FIG. 13 shows a conceptual diagram of the circuit of FIG. 12, When the bit repair data RP is "1", it is equivalent to shift the response data "0" to the output of the NAND gate 96 on the right side, so that the response data "0" occurs on the same position as the input position; when the bit repair data RP is "0", it is equivalent to shift the response data "0" down-right to the output of the NAND gate 98, so that the response data "0" occurs on the position different from the input position.

Figure 14:
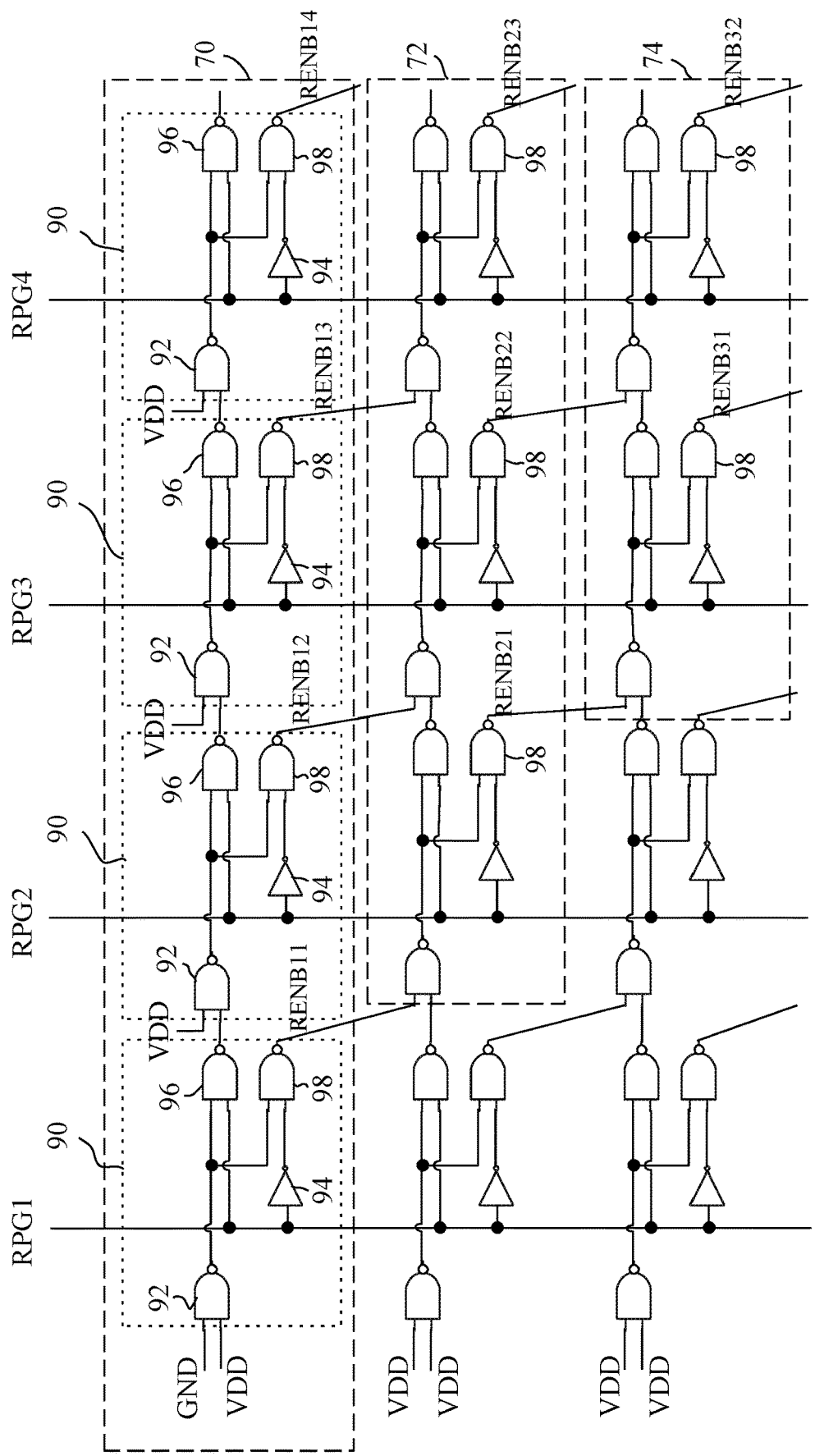
FIG. 14 shows an embodiment of a determination circuit of FIG. 10.
Figure 15:
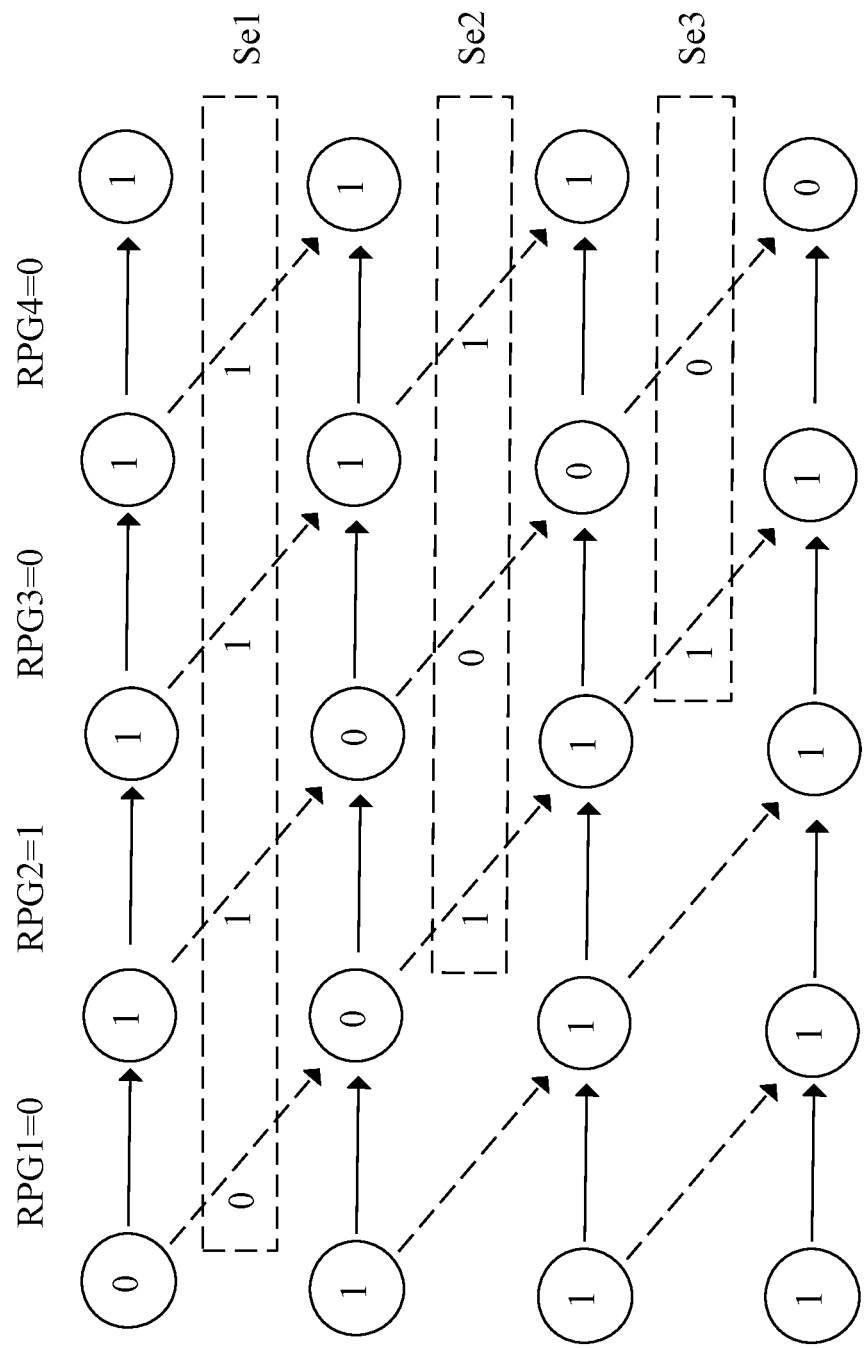
FIG. 15 is a conceptual diagram of the circuit of FIG. 14.

FIG. 14 shows embodiments of the determination circuits 70, 72 and 74 of FIG. 10. As shown in FIG. 14, each of the determination circuits 70, 72 and 74 is formed by serially connecting the N basic circuits 90. Since the preset response data GND"0" is inputted to the basic circuit 90 at a top-left position, the output at the relative down-right position becomes the desired selection signal. As shown in FIG. 14, the signals RENB11, RENB12, RENB13 and RENB14 outputted from the NAND gate 98 of the determination circuit 70 can form the selection signal Se1 of FIG. 10. The signal RENB21, RENB22 and RENB23 outputted from the NAND gate 98 of determination circuit 72 can form the selection signal Se2 of FIG. 10. The signal RENB31 and RENB32 outputted from the NAND gate 98 of the determination circuit 74 can form the selection signal Se3 of FIG. 10. FIG. 14 merely shows partial circuits of the determination circuits 70, 72 and 74, and one of ordinary skill in the art can derive entire circuits of the determination circuits 70, 72 and 74 based on the content shown in FIG. 14. FIG. 15 shows a conceptual diagram of the circuit of FIG. 14. Please refer to FIGS. 11, 14 and 15. In the determination circuit 70, the first basic circuit 90 receives response data "0(GND)", and the bit repair data RPG1 is "0"; the response data "0" is outputted from the NAND gate 98 and the input signals of the NAND gates 92 of the basic circuits 90 after the second basic circuit 90 are "1", so the output signal of the NAND gate 98 is "1" regardless of values of the pieces of bit repair data RPG2, RPG3 and RPG4, as shown in FIG. 15; thus, the selection signal Se1 is changed to "0111", the multiplexer 78 selects and couples the G1(DG1) to the input/output terminal I/O1, the position of the response data "0" in the selection signal can be used to determine the redundancy memory bit to be selected. In determination circuit 72, the first basic circuit 90 receives response data "0" and the bit repair data RPG2 is "1", the NAND gate 98 outputs a signal "0", and the response data "0" is transmitted to the second basic circuit 90 through the NAND gate 96, and the bit repair data RPG3 of the second basic circuit 90 is "0", the response data "0" is outputted from the NAND gate 98, and the input signals of the basic circuits 90 after the third basic circuit 90 are "1", so the output signal of the NAND gate 98 is "1" regardless of the value of the bit repair data RPG4, thereby obtaining the selection signal Se2 of "101"; as a result, the multiplexer 80 selects and couples the second memory bit G3(DG3) of the memory bits, which are coupled to the multiplexer 80, to the input/output terminal I/O2. The selection signals Se3~Sem are generated by the same manner, so the detailed description is not repeated. In the embodiment, the determination circuits 70, 72 and 74 are implemented by the plurality of NAND gates 92, 96 and 98; however, the implementation of the determination circuits 70, 72 and 74 are not limited to the NAND gate, and the determination circuits 70, 72 and 74 can be implemented by a plurality of NOR gates or a variety of logic gates; for example, when the preset response data is "1", the NAND gates 92, 96 and 98 can be replaced by NOR gates.

Figure 16:
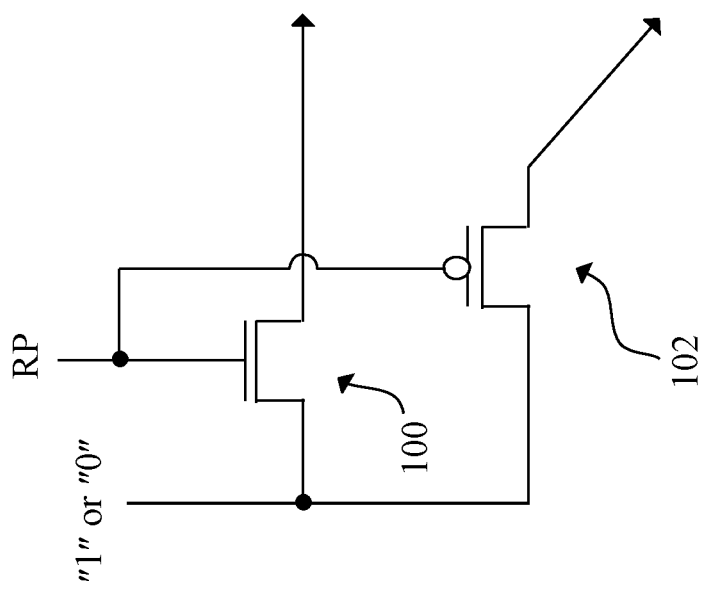
FIG. 16 shows another embodiment of the basic circuit of FIG. 12.

In other implementations, the basic circuit 90 of FIG. 12 can be modified as the switch circuit of FIG. 16. The switch circuit includes an NMOS transistor 100 and a PMOS transistor 102. The transistors 100 and 102 have input terminals for receiving response data "1" or "0", and control terminals for receiving the bit repair data RP. When the bit repair data RP is "0", the NMOS transistor 100 is turned off and the PMOS transistor 102 is turned on, so the response data "1" or "0" is outputted through the lower PMOS transistor 102; when the bit repair data RP is "1", the NMOS transistor 100 is turned on and the PMOS transistor 102 is turned off, so the response data "1" or "0" is outputted through the upper NMOS transistor 100.

The circuit of FIG. 5 can be used as an accumulation circuit. Please refer to FIGS. 5 and 7. As described above, when the bit repair data RPGm is "1", it indicates that the corresponding memory bit is a defective bit, and at the same time, the position of the preset response data "0" in the selection signal is changed correspondingly, as shown in FIG. 7, every time a defective bit occurs, the position of the data "0" is shifted downwardly by one, thus, so that the number of the defective memory bits can be determined based on the position of the response data "0" in the selection signal; for example, when the selection signal is "011" and the data "0" is at the first position, it indicates that there is a defective bit, and when the selection signal is "110" and the data "0" is at the third position, it indicates that there are three defective bits. The determination circuits 20, 22, 24 and 26 of the present invention can be used to determine whether the corresponding memory bit is a defective bit, and also used as the defective-bit accumulation circuit to accumulate the number of the defective bits. The accumulation circuit of FIG. 5 is not limited to be applied to the memory, and also can be applied to determine the number of the signals, which have level "0" or "1", of the plurality of signals RPG1~RPGm in the circuit other than the memory. Similarly, the circuit of FIG. 14 can be used as the accumulation circuit.

Figure 17:
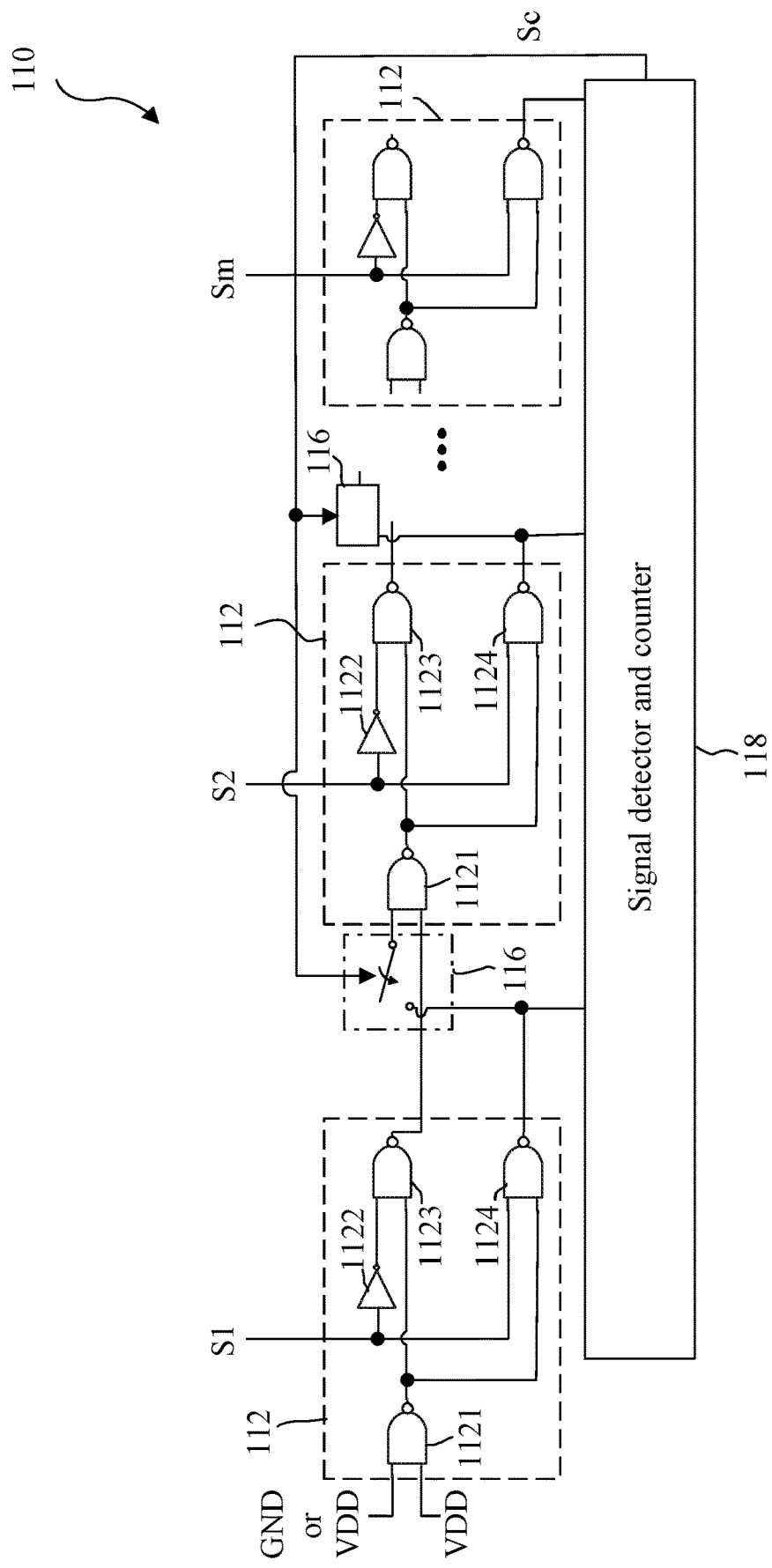
FIG. 17 shows an embodiment of an accumulation circuit.

FIG. 17 shows an accumulation circuit 110 developed based on the circuit concept of FIG. 5. As shown in FIG. 17, the accumulation circuit 110 includes a plurality of basic circuits 112, a plurality of switches 116, and a signal detector and counter 118. The plurality of basic circuits 112 can receive a plurality of signals S1~Sm, respectively, and when the accumulation circuit 110 is applied to count the number of the defective bits in the memory, the signals S1~Sm are pieces of bit repair data. In the embodiment, the architecture of the basic circuit 112 is the same as that of the basic circuit 50 of FIG. 5, that is, each basic circuit 112 includes three NAND gates 1121, 1123 and 1124, and an inverter 1122; in other implementations, the basic circuit 112 can be implemented by multiple NOR gates, or implemented by a combination of different logic gate elements. Since the basic circuit 112 is formed by simple logic gates, the architecture of the accumulation circuit 110 is simple and has a small area. As shown in the first basic circuit 112, a first input terminal of the NAND gate 1121 receives the signal GND="0" or VDD="1", a second input terminal of the NAND gate 1121 receives the signal VDD="1", wherein the signal GND="0" is the preset response data. An output terminal of the NAND gate 1121 is connected to input terminals of the NAND gates 1123 and 1124, the signal S1 is connected to the other input terminal of the NAND gate 1124, and also connected to the other input terminal of the NAND gate 1123 through the inverter 1122. When the signal received by the first input terminal of the NAND gate 1121 of the first basic circuit 112 is VDD, it indicates that the accumulation circuit 110 is in a disabled state; when the signal received by the first input terminal of the NAND gate 1121 is GND, it indicates that the accumulation circuit 110 is in an enabled state. In an condition that the signal of the first input terminal of the NAND gate 1121 of the first basic circuit 112 is changed from VDD to GND, when the signal S1 is "1", the NAND gate 1123 outputs signal "1" and the NAND gate 1124 outputs signal "0"; when the signal detector and counter 118 detects that the signal outputted from the NAND gate 1124 is the response data "0", the counting value of the signal detector and counter 118 is increased by 1, and at the same time, the signal detector and counter 118 outputs a control signal Sc; in contrast, when the signal S1 is "0", the NAND gate 1123 outputs signal "0" and the NAND gate 1124 outputs signal "1", and when the signal detector and counter 118 detects that the signal outputted from the NAND gate 1124 is not the response data "0", the counter does not work. The output terminal of the NAND gate 1123 of the basic circuit 112 of the previous stage is connected to the first input terminal of the NAND gate 1121 of the basic circuit 112 of the next stage, the switch 116 is connected to the second input terminal of the NAND gate 1121 of the basic circuit 112 of the next stage, and the switch 116 is controlled by the control signal Sc outputted from the signal detector and counter 118. In an initial state, the second input terminal of the NAND gate 1121 of the basic circuit 112 of the next stage is set as VDD (not shown in figures); when the signal outputted from the NAND gate 1124 is the response data "0", the signal detector and counter 118 outputs the control signal Sc, so that the switch 116 connects the output terminal of the NAND gate 1124 of the previous basic circuit 112 of the previous stage to the second input terminal of the NAND gate 1121 of the basic circuit 112 of the next stage, to input the preset response data GND="0" to the basic circuit 112 of the next stage. Simply speaking, in the embodiment of FIG. 17, the Mth basic circuit 112 receives the Mth signal SM, and when the level of the Mth signal SM is "1", the Mth basic circuit provides preset response data GND="0" to the signal detector and counter 118, so that the counting value of the signal detector and counter 118 is increased to accumulate the number of the signals with the level "1". In other implementations, the signal detector and counter 118 can also accumulate the number of the signals with level "0" in the accumulation signals S1~Sm. In an embodiment, the basic circuit 112 can be implemented by the circuit shown in FIG. 8.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A method of reordering memory bits, configured to select and couple a plurality of good memory bits of a plurality of memory bits to a plurality of input/output terminals of a memory, respectively, and the method comprising:
   providing a plurality of bit repair data corresponding to a plurality of general memory bits of the plurality of memory bits, respectively, wherein each of the plurality of bit repair data is configured to mark whether a corresponding general memory bit is a defective bit;
   generating a plurality of selection signals based on the plurality of bit repair data;

when the corresponding general memory bit is marked a good bit, coupling the corresponding general memory bit to one of the plurality of the input/output terminals; and when the corresponding general memory bit is marked the defective bit, selecting and coupling the corresponding general memory bit to one of the plurality of the input/output terminals based on a corresponding selection signal.

2. The method according to claim 1, wherein the step of generating the plurality of selection signals based on the plurality of bit repair data comprises:

generating a first selection signal of the plurality of selection signals and an accumulation signal based on a first bit repair data of the plurality of bit repair data, wherein the first selection signal comprises response data, and the first bit repair data determines a position of the response data in the first selection signal, the first selection signal selects a redundancy memory bit based on the position of the response data;

generating a second selection signal of the plurality of selection signals based on a second bit repair data of the plurality bit repair data and the accumulation signal, wherein the second selection signal comprises the response data, the second bit repair data determines a position of the response data in the second selection signal, and the second selection signal selects a redundancy memory bit based on the position of the response data.

3. A reordering circuit of a memory, wherein the reordering circuit is connected between a plurality of memory bits and a plurality of input/output terminals of the memory and configured to select the plurality of memory bits coupled to the plurality of input/output terminals, and the plurality of memory bits comprise a plurality of general memory bits and a plurality of redundancy memory bits, and the reordering circuit comprises:

a plurality of determination circuits configured to receive a plurality of first bit repair data corresponding to the plurality of general memory bits, respectively, and generate a plurality of selection signals based on the plurality of first bit repair data;

wherein each of the plurality of selection signals comprises a response data, and a position of the response data in each of the plurality of selection signals is determined by a first bit repair data corresponding thereto;

wherein the plurality of first bit repair data and the plurality of selection signals are used to select and couple a plurality of good memory bits of the plurality of memory bits to the plurality of input/output terminals, respectively;

wherein each of the plurality of first bit repair data is configured to mark whether a corresponding general memory bit is a defective bit.

4. The reordering circuit according to claim 3, further comprising:

a plurality of multiplexers connected to the plurality of determination circuits, respectively, and connected to the plurality of input/output terminals, respectively, wherein each of the plurality of multiplexers is coupled to one of the plurality of general memory bits and at least one of the plurality of redundancy memory bits, and configured to couple a memory bit to a corresponding input/output terminals based on a received first bit repair data and a received selection signal.

5. The reordering circuit according to claim 4, further comprising:

a redundancy bit ordering circuit coupled to the plurality of redundancy memory bits, and configured to couple good bits of the plurality of redundancy memory bits to the plurality of multiplexers based on a plurality of second bit repair data corresponding to the plurality of redundancy memory bits, wherein each of the plurality of second bit repair data is used to mark whether a corresponding redundancy memory bits is a defective bit.

6. The reordering circuit according to claim 3, wherein each of the plurality of determination circuits comprises a plurality of NAND gates or a plurality of NOR gates.

7. The reordering circuit according to claim 3, wherein each of the plurality of determination circuits comprises a plurality of MOS transistors.

8. The reordering circuit according to claim 3, wherein the plurality of selection signals are used to determine the number of defective bits of the plurality of general memory bits.

9. A method of reordering memory bits, configured to select and couple a plurality of good memory bits of a plurality of memory bits to a plurality of input/output terminals, respectively, and the method comprising:

providing a plurality of bit repair data corresponding to the plurality of memory bits, respectively, wherein each of the plurality of bit repair data is used to mark whether a corresponding memory bit is a defective bit;

generating a selection signal based on Mth~(M+N)th ones of the plurality of bit repair data, wherein M and N are integers higher than 0; and based on the selection signal, selecting and coupling a good bit of Mth~(M+N)th memory bits to one of the plurality of input/output terminals.

10. A reordering circuit of the memory, wherein the reordering circuit is connected between a plurality of memory bits and a plurality of input/output terminals of the memory and configured to select ones of the plurality of memory bits coupled to the plurality of input/output terminals, and the plurality of memory bits comprise a plurality of general memory bits and a plurality of redundancy memory bits, and the reordering circuit comprises:

a plurality of determination circuits configured to receive a plurality of bit repair data corresponding to the plurality of memory bits;

wherein a Mth determination circuit of the plurality of determination circuits generates a selection signal based on Mth~(M+N)th ones of the plurality of bit repair data, and M and N are integers higher than 0;

wherein each of the plurality of bit repair data is used to mark whether a corresponding memory bit is a defective bit;

wherein the selection signal is used to select and couple a good memory bit of Mth~(M+N)th memory bits to one of the plurality of the input/output terminals.

11. The reordering circuit according to claim 10, further comprising:

a plurality of multiplexers connected to the plurality of determination circuits, respectively, wherein each of the plurality of multiplexers selects and couples a good memory bit of the Mth~(M+N)th memory bits to one of the plurality of the input/output terminals based on a selection signal provided by a corresponding determination circuit.

12. The reordering circuit according to claim 10, wherein each of the plurality of determination circuits comprises a plurality of NAND gates or NOR gates.

13. The reordering circuit according to claim 10, wherein each of the plurality of determination circuits comprises a plurality of MOS transistors.

* * * * *